United States Patent
Wu et al.

(10) Patent No.: US 11,563,381 B2
(45) Date of Patent: Jan. 24, 2023

(54) CONTROL METHOD OF SWITCHING CIRCUIT, CONTROL CIRCUIT OF SWITCHING CIRCUIT, AND SWITCHING CIRCUIT

(71) Applicant: JOULWATT TECHNOLOGY (HANGZHOU) CO. LTD., Hangzhou (CN)

(72) Inventors: Minghao Wu, Hangzhou (CN); Guoqiang Liu, Hangzhou (CN); Xunwei Zhou, Hangzhou (CN)

(73) Assignee: JOULWATT TECHNOLOGY (HANGZHOU) CO. LTD., Hangzhou (CN)

(*) Notice: Subject to any disclaimer, the term of this patent is extended or adjusted under 35 U.S.C. 154(b) by 49 days.

(21) Appl. No.: 17/094,824

(22) Filed: Nov. 11, 2020

(65) Prior Publication Data
US 2021/0194373 A1 Jun. 24, 2021

(30) Foreign Application Priority Data
Dec. 20, 2019 (CN) .......................... 201911328779.9

(51) Int. Cl.
*H02M 3/335* (2006.01)
*G01R 19/165* (2006.01)
(Continued)

(52) U.S. Cl.
CPC .. *H02M 3/33576* (2013.01); *G01R 19/16538* (2013.01); *G01R 19/175* (2013.01);
(Continued)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18;
(Continued)

(56) References Cited

U.S. PATENT DOCUMENTS 6,469,917 B1 * 10/2002 Ben-Yaakov ....... H02M 1/4225
363/44
9,391,511 B2 * 7/2016 Yu ........................... H02M 1/08
(Continued)

*Primary Examiner* — Thienvu V Tran
*Assistant Examiner* — Nusrat Quddus
(74) *Attorney, Agent, or Firm* — Bayramoglu Law Offices LLC

(57) ABSTRACT

A control method of a switching circuit, a control circuit of the switching circuit, and the switching circuit are provided. The switching circuit includes an inductor or a transformer. An operational amplification is performed on an output feedback voltage and a first reference voltage of the switching circuit to obtain a compensation voltage. The compensation voltage controls an on-time of a main switch of the switching circuit. When the current of the inductor or the transformer drops to a threshold, after a time, the main switch is switched from off to on, and the output feedback voltage controls the time. When the output feedback voltage is higher than a first threshold voltage, the compensation voltage is pulled down. When the output feedback voltage is lower than a second threshold voltage, the compensation voltage is pulled up.

9 Claims, 3 Drawing Sheets

(51) Int. Cl.
*G01R 19/175* (2006.01)
*H03K 5/24* (2006.01)
*H02M 1/00* (2006.01)

(52) U.S. Cl.
CPC ............. *H03K 5/24* (2013.01); *H02M 1/0009* (2021.05); *H02M 1/0025* (2021.05)

(58) Field of Classification Search
CPC ... G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 3/22; H02M 1/08; H02M 1/36; H02M 3/24; H02M 3/325; H02M 3/335; H02M 3/28; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H05B 39/048; B23K 11/24; H04B 2215/069; Y02B 70/1491
See application file for complete search history.

(56) References Cited

U.S. PATENT DOCUMENTS

| | | | | |
|---|---|---|---|---|
| 10,205,448 B2* | 2/2019 | Xu | ............. | H03K 17/166 |
| 10,218,272 B2* | 2/2019 | Chan | ............. | H02J 3/38 |
| 10,320,291 B2* | 6/2019 | Wong | ............. | H02M 3/157 |
| 10,396,658 B2* | 8/2019 | Chan | ............. | H02M 1/32 |
| 10,461,653 B1* | 10/2019 | Wong | ............. | H02M 3/33592 |
| 10,505,442 B2* | 12/2019 | Wong | ............. | H02M 1/38 |
| 10,886,853 B1* | 1/2021 | Xu | ............. | H02M 1/08 |
| 2008/0246455 A1* | 10/2008 | Chu | ............. | H02M 3/1588 323/283 |
| 2010/0265742 A1* | 10/2010 | Hu | ............. | H02M 3/33523 363/21.13 |
| 2011/0002068 A1* | 1/2011 | Hu | ............. | H02M 1/32 361/18 |
| 2011/0025283 A1* | 2/2011 | Futamura | ............. | H02M 3/1588 323/282 |
| 2011/0241641 A1* | 10/2011 | Chen | ............. | H02M 3/1588 323/284 |
| 2011/0305053 A1* | 12/2011 | Lin | ............. | H02M 3/33523 363/95 |
| 2012/0075891 A1* | 3/2012 | Zhang | ............. | H02M 1/08 363/21.18 |
| 2012/0161738 A1* | 6/2012 | Nakashima | ............. | H02M 3/158 323/284 |
| 2012/0299565 A1* | 11/2012 | Zhang | ............. | H02M 3/1588 323/282 |
| 2013/0063102 A1* | 3/2013 | Chen | ............. | H02M 3/156 323/234 |
| 2013/0113450 A1* | 5/2013 | Tang | ............. | H02M 1/00 323/283 |
| 2013/0200864 A1* | 8/2013 | Huang | ............. | H02M 3/156 323/271 |
| 2014/0159689 A1* | 6/2014 | Chen | ............. | H02M 3/156 323/282 |
| 2015/0189710 A1* | 7/2015 | Lin | ............. | H05B 45/385 315/224 |
| 2015/0303790 A1* | 10/2015 | Lin | ............. | H02M 1/4225 363/89 |
| 2016/0233768 A1* | 8/2016 | de Cremoux | ............. | H02M 3/1588 |
| 2017/0155319 A1* | 6/2017 | Deng | ............. | H02M 3/156 |
| 2017/0187282 A1* | 6/2017 | Wang | ............. | H02M 1/12 |
| 2017/0187290 A1* | 6/2017 | Li | ............. | H02M 3/1582 |
| 2017/0187298 A1* | 6/2017 | Lin | ............. | H02M 3/33553 |
| 2017/0271991 A1* | 9/2017 | Tsuruyama | ............. | G01R 19/0038 |
| 2017/0338738 A1* | 11/2017 | Sun | ............. | H02M 3/156 |
| 2018/0062509 A1* | 3/2018 | Duong | ............. | H02M 1/08 |
| 2018/0123450 A1* | 5/2018 | Moon | ............. | H02M 3/04 |
| 2018/0287479 A1* | 10/2018 | Li | ............. | H02M 1/08 |
| 2019/0115841 A1* | 4/2019 | Maruyama | ............. | H02M 3/156 |
| 2020/0136507 A1* | 4/2020 | Tiruchengode Tirumurugga Bupathi | ............. | H04R 3/02 |

* cited by examiner

CONTROL METHOD OF SWITCHING CIRCUIT, CONTROL CIRCUIT OF SWITCHING CIRCUIT, AND SWITCHING CIRCUIT

CROSS REFERENCE TO THE RELATED APPLICATIONS

This application is based upon and claims priority to Chinese Patent Application No. 201911328779.9, filed on Dec. 20, 2019, the entire contents of which are incorporated herein by reference.

TECHNICAL FIELD

The present invention relates to the technical field of power electronics, and more particularly to a control method of a switching circuit, a control circuit of the switching circuit, and the switching circuit.

BACKGROUND

In the switching power supply, especially in the switching power supply using alternating current (AC) input with power factor correction, the input is rectified, which causes the system to generate a secondary line frequency ripple. Therefore, in the compensation circuit of the switching power supply using AC input, the speed of compensation is lower than half a line cycle. Although the system can eventually stabilize, the response is relatively slow. When the switching power supply adopting AC input works in a discontinuous conduction mode, in the prior art, the frequency is reduced according to the compensation voltage. The compensation voltage, however, changes slowly, so that the adjustment process of prior systems under the light load is very long, the output voltage fluctuates sharply during the adjustment process, and the response time is long. Since the speed of the compensation voltage is lower than half a line cycle, the response speed of frequency reduction is also lower than half a line cycle in the discontinuous conduction mode. Therefore, in order to solve the problems of the control of the switching power supply using AC input, it is desirable to achieve the stability of the system in the switching power supply adopting the AC input while accelerating the response of the system to the output voltage.

SUMMARY

In view of the above, an objective of the present invention is to provide a control method of a switching circuit, a control circuit of the switching circuit, and the switching circuit to solve the problems of the slow response of the system in the prior art.

The present invention provides a control method of a switching circuit. The switching circuit includes an inductor or a transformer. The control method includes: performing an operational amplification on an output feedback voltage and a first reference voltage of the switching circuit to obtain a compensation voltage; controlling a on-time of a main switch of the switching circuit by the compensation voltage; when the current of the inductor or the transformer drops to a first current threshold, after a first time, switching the main switch from being off to being on, and controlling the first time by the output feedback voltage.

As an alternative solution, the first time is proportional to the difference between the output feedback voltage and a second reference voltage.

As an alternative solution, when the output feedback voltage is higher than a first threshold voltage, the compensation voltage is pulled down; or/and, when the output feedback voltage is lower than a second threshold voltage, the compensation voltage is pulled up.

Another solution of the present invention is to provide a control circuit of a switching circuit. The switching circuit includes an inductor or a transformer. The control circuit performs an operational amplification on an output feedback voltage and a first reference voltage of the switching circuit to obtain a compensation voltage. The compensation voltage controls a on-time of a main switch of the switching circuit. When the control circuit detects that the current of the inductor or the transformer drops to a first current threshold, after a first time, the control circuit controls the main switch to be switched from off to on, and the output feedback voltage controls the first time.

As an alternative solution, the first time is proportional to the difference between the output feedback voltage and a second reference voltage.

As an alternative solution, the control circuit further includes a first operational amplifier and a switching signal generating circuit.

The first operational amplifier performs the operational amplification on the output feedback voltage and the first reference voltage, and outputs the compensation voltage. The compensation voltage passes through the switching signal generating circuit to generate a switching signal. The switching signal controls the main switch to be switched on and switched off.

The switching signal generating circuit further receives the output feedback voltage. When the current of the inductor or the transformer drops to zero, after the first time, the switching signal generating circuit generates a switching-on signal for the main switch.

As an alternative solution, the switching signal generating circuit includes a second operational amplifier, a timer circuit, and a flip-flop.

The second operational amplifier receives the output feedback voltage and generates the difference between the output feedback voltage and the second reference voltage. The timer circuit receives an output voltage of the second operational amplifier, and starts counting from a moment when the current of the inductor or the transformer becomes zero. When the timer circuit counts upward to the first time, an output of the timer circuit steps. The flip-flop receives the output of the timer circuit, and when the output of the timer circuit steps, the switching signal changes from being invalid to being valid, indicating that the main switch is switched from off to on.

As an alternative solution, the control circuit further includes a first comparator and a pull-down circuit. The first comparator compares the output feedback voltage with a first threshold voltage, and when the output feedback voltage is higher than the first threshold voltage, the pull-down circuit pulls down the compensation voltage. Additionally, or optionally, the control circuit further includes a second comparator and a pull-up circuit. The second comparator compares the output feedback voltage with a second threshold voltage, and when the output feedback voltage is lower than the second threshold voltage, the pull-up circuit pulls up the compensation voltage.

As an alternative solution, the switching circuit adopts the constant on-time control. The switching signal generating circuit includes a on-time generating circuit. The on-time generating circuit receives the compensation voltage, and generates a switch on-time according to the compensation voltage. The flip-flop controls a moment when the switching signal changes from being valid to being invalid according to the switch on-time.

As an alternative solution, the switching circuit is a buck circuit, a buck-boost circuit, a flyback circuit, or a boost circuit.

Another technical solution of the present invention is to provide a switching circuit.

Compared with the prior arts, the structure and method of the circuit according to the present invention have advantages such as the stability of the system and the fast response to the output voltage.

DETAILED DESCRIPTION OF THE EMBODIMENTS

The preferred embodiments of the present invention are described in detail below with reference to the drawings, but the present invention is not limited to these embodiments. The present invention covers any substitution, modification, equivalent method and solution made within the spirit and scope of the present invention.

For a better understanding of the present invention, the specific details of the following preferred embodiments of the present invention are explained herein after in detail, while the present invention can also be fully understood by those skilled in the art without the description of these details.

The present invention is described in detail by giving examples with reference to the drawings. It should be noted that the drawings are simplified and do not use an accurate proportion, that is, the drawings merely are for the objectives of clearly and conveniently illustrating embodiments of the present invention.

The present invention provides a control circuit of a switching circuit. The switching circuit includes an inductor or a transformer. The control circuit performs an operational amplification on an output feedback voltage FB and a first reference voltage of the switching circuit to obtain a compensation voltage COMP. The compensation voltage COMP controls an on-time of a main switch of the switching circuit. When the control circuit detects that the current of the inductor or the transformer drops to a first current threshold, after a first time, the control circuit controls the main switch to be switched from off to on, and the output feedback voltage controls the first time.

Figure 1:
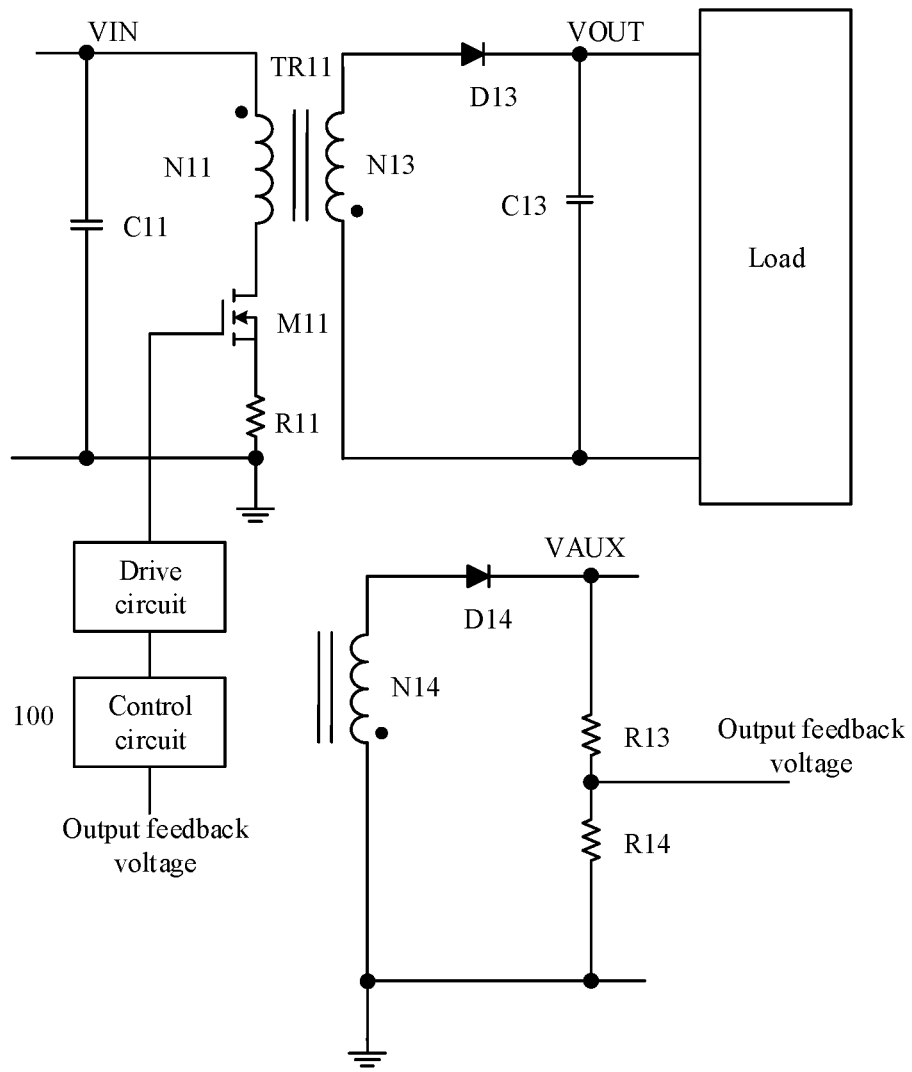
FIG. 1 is a functional block diagram of a flyback circuit of a control circuit according to an embodiment of the present invention.

FIG. 1 is a functional block diagram of a flyback circuit of the control circuit according to an embodiment of the present invention. The output feedback voltage FB represents an output voltage. As shown in FIG. 1, the output feedback voltage FB is obtained after the auxiliary winding output voltage VAUX passes through a voltage-dividing resistor. The manner in which the output feedback voltage FB is obtained is not limited to the manner in FIG. 1, for example, the output voltage may be directly sampled, or the output voltage may be divided by a resistor to obtain the output feedback voltage FB. When the first current threshold is zero, the switching circuit works in a discontinuous conduction mode DCM, and the first time is the time when the current of the inductor or the transformer is zero. When the first current threshold is greater than zero, the switching circuit works in a continuous conduction mode.

The output feedback voltage FB directly controls the first time, which accelerates the response of the system to the change in the output voltage and optimizes the transient response characteristic of the system. When the switching circuit adopts an AC input, especially the AC input with power factor correction PFC, the compensation voltage changes slowly, and the change in the compensation voltage is lower than the secondary line frequency, while the output feedback voltage is adopted to directly control the first time, which greatly optimizes the transient response characteristic of the system. The present invention is not limited to the AC input, and can be applied to a system with a direct current (DC) input.

It should be noted that FIG. 1 shows an embodiment that the control circuit is used in a flyback circuit. The present invention is not limited to this and can be used in other switching circuits such as a buck circuit, a boost circuit, a buck-boost circuit and so on.

In an embodiment, the first time is proportional to the difference between the output feedback voltage FB and a second reference voltage. When the switching circuit is a boost circuit, the output voltage is sampled through the voltage-dividing resistor to obtain the output feedback voltage. During the entire switching cycle, the output feedback voltage FB always represents the output voltage. When the switching circuit is a flyback circuit, as shown in FIG. 1, the auxiliary winding voltage is sampled through the voltage-dividing resistor, and the output feedback voltage FB represents the output voltage provided that the diode or the synchronous rectifier is turned on. Therefore, it is necessary to detect the output feedback voltage FB when the diode or the synchronous rectifier is turned on.

Figure 2:
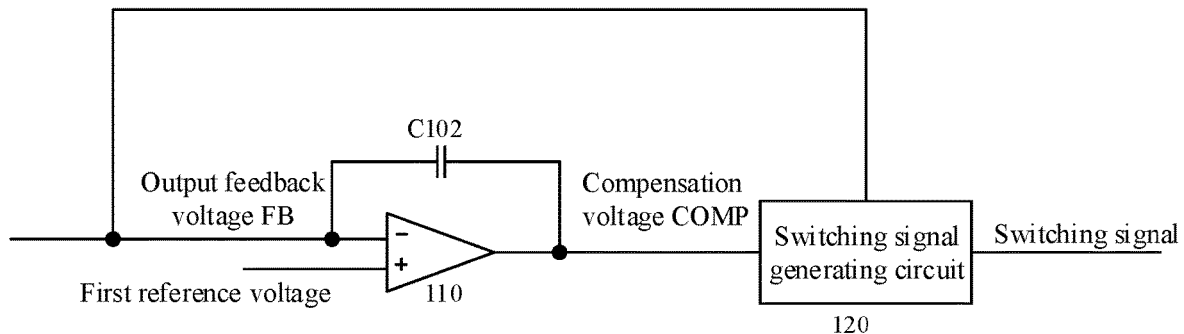
FIG. 2 is a functional block diagram of the control circuit according to an embodiment of the present invention.

In an embodiment, as shown in FIG. 2, the control circuit further includes the first operational amplifier 110 and the switching signal generating circuit 120. The first operational amplifier 110 performs the operational amplification on the output feedback voltage FB and the first reference voltage, and outputs the compensation voltage COMP. The compensation voltage COMP passes through the switching signal generating circuit 120 to generate a switching signal. The switching signal controls the main switch to be switched on and switched off. The switching signal generating circuit further receives the output feedback voltage FB. When the current of the inductor or the transformer drops to the first current threshold, after the first time, the switching signal generating circuit generates a switching-on signal for the main switch. When the first current threshold is zero, the switching circuit works in the discontinuous conduction mode.

Figure 3:
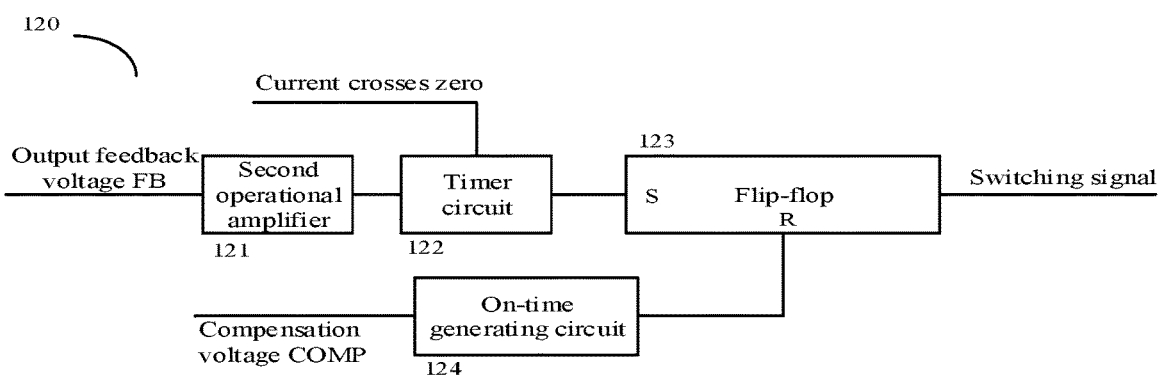
FIG. 3 is a functional block diagram of a switching signal generating circuit according to embodiment of the present invention.

In an embodiment, as shown in FIG. 3, the switching signal generating circuit 120 includes the second operational amplifier 121, the timer circuit 122, and the flip-flop 123. The second operational amplifier receives the output feedback voltage FB and generates the difference between the output feedback voltage and the second reference voltage. The timer circuit receives the output voltage of the second operational amplifier. When the first current threshold is zero, the timer circuit starts counting upward from the moment when the current of the inductor or the transformer becomes zero. When the timer circuit counts up to the first time, the output of the timer circuit steps. The flip-flop 123 receives the output of the timer circuit, and when the output of the timer circuit steps, the switching signal changes from being invalid to being valid, indicating that the main switch is switched from off to on.

Figure 4:
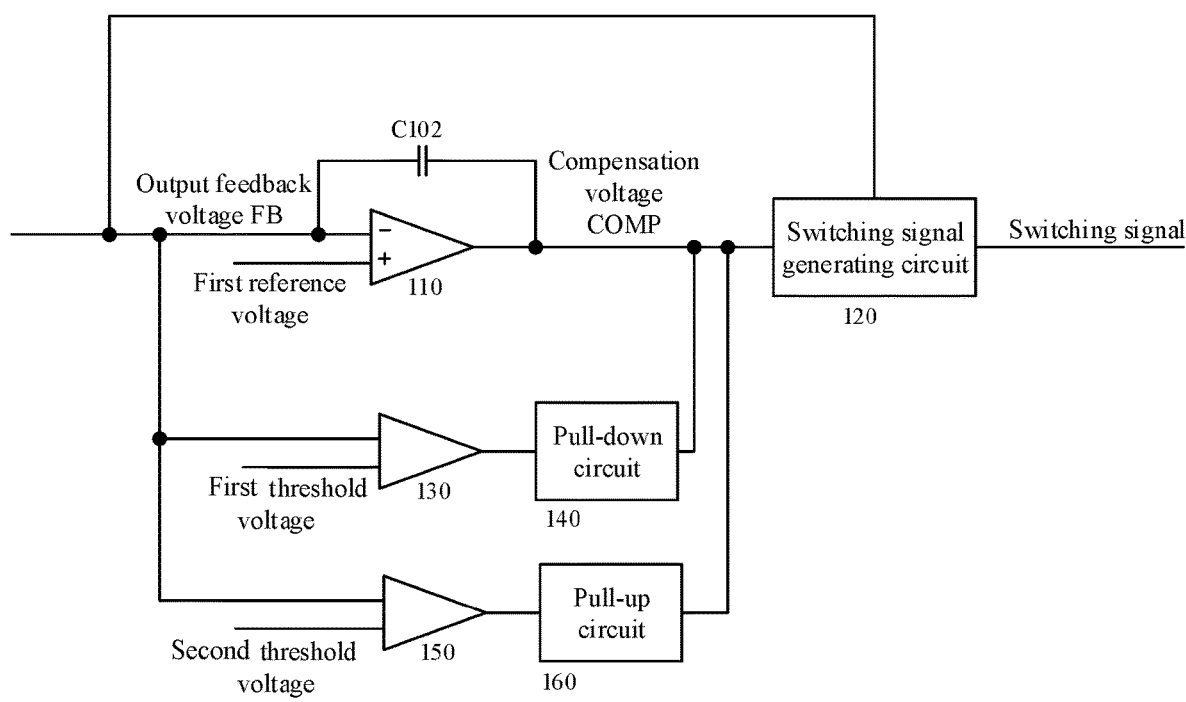
FIG. 4 is a functional block diagram of the control circuit according to another embodiment of the present invention.

In an embodiment, as shown in FIG. 4, the control circuit further includes the first comparator 130 and the pull-down circuit 140. The first comparator 130 compares the output feedback voltage FB with a first threshold voltage. When the output feedback voltage FB is higher than the first threshold voltage, the pull-down circuit 140 pulls down the compensation voltage. Additionally, or optionally, the control circuit further includes the second comparator 150 and the pull-up circuit 160. The second comparator 150 compares the output feedback voltage FB with a second threshold voltage. When the output feedback voltage FB is lower than the second threshold voltage, the pull-up circuit 160 pulls up the compensation voltage. Since the first time is controlled by the output feedback voltage FB in the present invention, when the output feedback voltage FB is higher than the first threshold voltage and the compensation voltage COMP is pulled down, the response speed of the system is accelerated without causing the instability of the system.

In an embodiment, as shown in FIG. 3, the switching circuit adopts the constant on-time control. The switching signal generating circuit includes the on-time generating circuit 124. The on-time generating circuit receives the compensation voltage COMP, and generates a switch on-time according to the compensation voltage. The flip-flop controls the moment when the switching signal changes from being valid to being invalid according to the switch on-time. The present invention is not limited to the constant on-time control, and also can use other control methods, such as the peak current control.

The present invention further provides a control method of a switching circuit. The switching circuit includes an inductor or a transformer. An operational amplification is performed on an output feedback voltage and a first reference voltage of the switching circuit to obtain a compensation voltage. The compensation voltage controls an on-time of a main switch of the switching circuit. When the current of the inductor or the transformer drops to a first current threshold, after a first time, the main switch is switched from off to on, and the output feedback voltage controls the first time.

In an embodiment, the first time is proportional to the difference between the output feedback voltage and a second reference voltage.

In an embodiment, when the output feedback voltage is higher than a first threshold voltage, the compensation voltage is pulled down; or/and, when the output feedback voltage is lower than a second threshold voltage, the compensation voltage is pulled up.

Another technical solution of the present invention is to provide a switching circuit using the control method mentioned above or including the control circuit mentioned above.

Although the embodiments are separately illustrated and described above, the embodiments contain some common technologies. Those skilled in the art can replace and integrate the embodiments. Any content not clearly recorded in one of the embodiments may be determined based on another embodiment where the content is recorded.

The embodiments described above do not constitute a limitation on the scope of protection of the technical solution of the present invention. Any modification, equivalent replacement, and improvement made within the spirit and principle of the above-mentioned embodiments shall fall within the scope of protection of the technical solution of the present invention.

The invention claimed is:

1. A control method of a switching circuit, wherein, the switching circuit comprises an inductor or a transformer; the control method comprises:
    performing an operational amplification on an output feedback voltage, using a first operational amplifier, wherein the first operational amplifier a compensation voltage based on a difference between the output feedback voltage and a first reference voltage;
    controlling an on-time of a main switch of the switching circuit by the compensation voltage;
    when a current of the inductor or the transformer drops to a current threshold, after a time, switching the main switch from being off to being on; and
    controlling the time by the output feedback voltage;
    performing another operational amplification on the output feedback voltage, using a second operational amplifier, wherein the second operational amplifier is generating an output voltage based on a difference between the output feedback voltage and a second reference voltage; receiving the output voltage of the second operational amplifier by a timer circuit, and starting counting up from a moment when the current of the inductor or the transformer becomes zero by the timer circuit; when the timer circuit counts up to the time, cause an output of the timer circuit to change;
    wherein, when the output feedback voltage is higher than a first threshold voltage, the compensation voltage is pulled down, by a pull-down circuit; alternatively, when the output feedback voltage is lower than a second threshold voltage, the compensation voltage is pulled up, by a pull-up circuit.

2. The control method of claim 1, wherein, the time is proportional to a difference between the output feedback voltage and a second reference voltage.

3. A control circuit of a switching circuit, wherein, the switching circuit comprises an inductor or a transformer; wherein,
    the control circuit performs an operational amplification on an output feedback voltage, using a first operational amplifier, wherein the first operational amplifier is amplifying a difference between the output feedback voltage and a first reference voltage to generate a compensation voltage; the compensation voltage controls an on-time of a main switch of the switching circuit; when the control circuit detects that a current of the inductor or the transformer drops to a current threshold, after a time, the control circuit controls the main switch to be switched from off to on, and the output feedback voltage controls the time;
    the control circuit further comprising a switching signal generating circuit, wherein the switching signal generating circuit further receives the output feedback voltage; when the current of the inductor or the transformer drops to zero, after the time, the switching signal generating circuit generates a switching-on signal for the main switch,
    the switching signal generating circuit comprising a second operational amplifier and a timer circuit, wherein the second operational amplifier receives the output feedback voltage and the second operational amplifier generates the difference between the output feedback voltage and a second reference voltage; the timer circuit receives an output voltage of the second operational amplifier, and the timer circuit starts counting up from a moment when the current of the inductor or the transformer becomes zero; when the timer circuit counts up to the time, cause an output of the timer circuit to change;

wherein the control circuit further comprising a first comparator and a pull-down circuit wherein the first comparator compares the output feedback voltage with a first threshold voltage, and when the output feedback voltage is higher than the first threshold voltage, the pull-down circuit pulls down the compensation voltage; and alternatively, the control circuit further comprises a second comparator and a pull-up circuit wherein, the second comparator compares the output feedback voltage with a second threshold voltage, and when the output feedback voltage is lower than the second threshold voltage, the pull-up circuit pulls up the compensation voltage.

4. The control circuit of claim 3, wherein, the time is proportional to a difference between the output feedback voltage and a second reference voltage.

5. The control circuit of claim 4, the compensation voltage passes through the switching signal generating circuit to generate a switching signal; the switching signal controls the main switch to be switched on and switched off.

6. The control circuit of claim 5, wherein the switching signal generating circuit comprises a flip-flop; wherein, the flip-flop receives the output of the timer circuit; and when the output of the timer circuit changes, the switching signal changes from being invalid to being valid, indicating that the main switch is switched from off to on.

7. The control circuit of claim 6, wherein, the switching circuit adopts a constant on time control; the switching signal generating circuit comprises an on-time generating circuit; the on-time generating circuit receives the compensation voltage, and the on-time generating circuit generates a switch on-time according to the compensation voltage; the flip-flop controls a moment when the switching signal changes from being valid to being invalid according to the switch on-time.

8. The control circuit of claim 3, wherein, the switching circuit is a buck circuit, a buck-boost circuit, a flyback circuit, or a boost circuit.

9. A control circuit of a switching circuit, wherein, the switching circuit comprises an inductor or a transformer; wherein, the control circuit performs an operational amplification on an output feedback voltage, using a first operational amplifier, wherein the first operational amplifier is amplifying a difference between the output feedback voltage and a first reference voltage to generate a compensation voltage; the compensation voltage controls an on-time of a main switch of the switching circuit when the control circuit detects that a current of the inductor or the transformer drops to a current threshold, after a time, the control circuit controls the main switch to be switched from off to on, and the output feedback voltage controls the time;

the control circuit further comprising a switching signal generating circuit, wherein the switching signal generating circuit further receives the output feedback voltage; when the current of the inductor or the transformer drops to zero, after the time, the switching signal generating circuit generates a switching-on signal for the main switch, the switching signal generating circuit comprising a second operational amplifier and a timer circuit, wherein the second operational amplifier receives the output feedback voltage and the second operational amplifier generates the difference between the output feedback voltage and a second reference voltage; the timer circuit receives an output voltage of the second operational amplifier, and the timer circuit starts counting up from a moment when the current of the inductor or the transformer becomes zero; when the timer circuit counts up to the time, cause an output of the timer circuit to change; and wherein the control circuit further comprising a first comparator, a pull-down circuit, a second comparator and a pull-up circuit; wherein, the first comparator compares the output feedback voltage with a first threshold voltage, and when the output feedback voltage is higher than the first threshold voltage, the pull-down circuit pulls down the compensation voltage; the second comparator compares the output feedback voltage with a second threshold voltage, and when the output feedback voltage is lower than the second threshold voltage, the pull-up circuit pulls up the compensation voltage.

* * * * *